United States Patent
Hacker et al.

(10) Patent No.: US 6,361,820 B1
(45) Date of Patent: Mar. 26, 2002

(54) DIELECTRIC FILMS FROM ORGANOHYDRIDOSILOXANE RESINS WITH HIGH ORGANIC CONTENT

(75) Inventors: Nigel P. Hacker, Palo Alto; Scott P. Lefferts, Sunnyvale; Lisa K. Figge, Menlo Park; Michael D. Slessor, Campbell, all of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/609,499

(22) Filed: Jun. 30, 2000

Related U.S. Application Data

(62) Division of application No. 09/227,498, filed on Jan. 7, 1999, now Pat. No. 6,218,020.

(51) Int. Cl.$^7$ .............................. B05D 3/02; B05D 5/12
(52) U.S. Cl. ...................... 427/58; 427/240; 427/379; 427/387
(58) Field of Search .................... 427/387, 58, 240, 427/379

(56) References Cited

U.S. PATENT DOCUMENTS

| | | | |
|---|---|---|---|
| 2,637,718 A | 5/1953 | Rust | 260/46.5 |
| 3,615,572 A | 10/1971 | Collins et al. | 423/325 |
| 4,026,868 A | 5/1977 | Merrill | 260/46.5 |
| 4,399,266 A | 8/1983 | Matsumura et al. | 528/10 |
| 4,609,751 A | 9/1986 | Hajjar | 556/456 |
| 4,624,870 A | 11/1986 | Anthony | 427/387 |
| 4,626,556 A | 12/1986 | Nozue et al. | 522/99 |
| 4,670,299 A | 6/1987 | Fukuyama et al. | 427/96 |
| 4,694,040 A | 9/1987 | Hashimoto et al. | 524/765 |
| 4,723,978 A | 2/1988 | Clodgo et al. | 65/31 |
| 4,749,631 A | 6/1988 | Haluska et al. | 428/704 |
| 4,753,855 A | 6/1988 | Haluska et al. | 428/702 |
| 4,756,977 A | 7/1988 | Haluska et al. | 428/704 |
| 4,808,653 A | 2/1989 | Haluska et al. | 524/398 |
| 4,822,697 A | 4/1989 | Haluska et al. | 428/698 |
| 4,847,162 A | 7/1989 | Haluska et al. | 428/457 |
| 4,849,296 A | 7/1989 | Haluska et al. | 428/457 |
| 4,895,914 A | 1/1990 | Saitoh et al. | 525/478 |
| 4,898,907 A | 2/1990 | Haluska et al. | 524/490 |
| 4,911,922 A | 3/1990 | Haluska et al. | 428/698 |
| 4,973,526 A | 11/1990 | Haluska | 428/697 |
| 4,999,397 A | 3/1991 | Weiss et al. | 524/755 |
| 5,008,320 A | 4/1991 | Haluska et al. | 524/361 |
| 5,010,159 A | 4/1991 | Bank et al. | 528/23 |
| 5,045,592 A | 9/1991 | Weiss et al. | 524/755 |
| 5,059,448 A | 10/1991 | Chandra et al. | 427/53.1 |
| 5,063,267 A | 11/1991 | Hanneman et al. | 524/284 |
| 5,085,893 A | 2/1992 | Weiss et al. | 427/387 |
| 5,091,162 A | 2/1992 | Frye et al. | 423/325 |
| 5,106,604 A | 4/1992 | Agaskar | 423/325 |
| 5,116,637 A | 5/1992 | Baney et al. | 427/340 |
| 5,118,530 A | 6/1992 | Hanneman et al. | 427/226 |
| 5,145,723 A | 9/1992 | Ballance et al. | 427/397.7 |
| 5,165,955 A | 11/1992 | Gentle | 427/575 |
| 5,183,684 A | 2/1993 | Carpenter | 427/574 |
| 5,210,168 A | 5/1993 | Bergstrom et al. | 528/12 |
| 5,238,787 A | 8/1993 | Haluska et al. | 430/325 |
| 5,258,334 A | 11/1993 | Lantz, II | 437/238 |
| 5,262,201 A | 11/1993 | Chandra et al. | 427/376.2 |
| 5,279,661 A | 1/1994 | Gentle | 106/287.1 |
| 5,283,545 A | 2/1994 | Pernisz | 338/308 |
| 5,290,354 A | 3/1994 | Haluska | 106/479 |
| 5,293,335 A | 3/1994 | Pernisz et al. | 365/148 |
| 5,310,583 A | 5/1994 | Eckstein et al. | 427/575 |
| 5,312,684 A | 5/1994 | Michael et al. | 428/336 |
| 5,320,868 A | 6/1994 | Ballance et al. | 427/228 |
| 5,336,532 A | 8/1994 | Haluska et al. | 427/515 |
| 5,348,839 A | 9/1994 | Haluska et al. | 430/270 |
| 5,370,903 A | 12/1994 | Mine et al. | 427/126.2 |
| 5,370,904 A | 12/1994 | Mine et al. | 427/126.2 |
| 5,372,842 A | 12/1994 | Mine et al. | 427/126.2 |
| 5,380,567 A | 1/1995 | Haluska | 427/578 |
| 5,416,190 A | 5/1995 | Mine et al. | 528/492 |
| 5,436,029 A | 7/1995 | Ballance et al. | 427/126.2 |
| 5,441,765 A | 8/1995 | Ballance et al. | 427/228 |
| 5,445,894 A | 8/1995 | Ballance et al. | 427/228 |
| 5,446,088 A | 8/1995 | Haluska | 524/588 |
| 5,486,564 A | 1/1996 | Mine et al. | 524/588 |
| 5,523,163 A | 6/1996 | Ballance et al. | 428/446 |
| 5,540,948 A | 7/1996 | Haluska | 427/96 |
| 5,547,703 A | 8/1996 | Camilletti et al. | 427/126.3 |
| 5,609,925 A | 3/1997 | Camilletti et al. | 427/503 |
| 5,618,878 A | 4/1997 | Syktich et al. | 524/588 |
| 5,635,240 A | 6/1997 | Haluska et al. | 427/180 |
| 5,670,596 A | 9/1997 | Razzano et al. | 528/16 |
| 5,707,681 A | 1/1998 | Bremmer et al. | 427/58 |
| 5,707,683 A | 1/1998 | Currie et al. | 427/126.2 |
| 5,853,808 A | 12/1998 | Arkles et al. | 427/377 |
| 5,858,544 A | 1/1999 | Banaszak Holl et al. | 428/447 |
| 5,859,162 A | 1/1999 | Yamamoto et al. | 528/31 |
| 5,859,168 A | 1/1999 | Yamamoto et al. | 528/31 |
| 6,143,360 A * | 11/2000 | Zhong | 427/244 |

FOREIGN PATENT DOCUMENTS

| | | |
|---|---|---|
| CA | 2100278 | 1/1994 |
| DE | 196 08 94 A1 | 9/1996 |

(List continued on next page.)

OTHER PUBLICATIONS

*Encyclopedia of Chemical Technology*, 4th Edition, John Wiley & Sons, Inc., 1995, vol. 14, p. 17.
Hacker, N., "Organic and Inorganic Spin–On Polymers for Low–Dielectric–Constant Applications," *MRS Bulletin*, vol. 22, No. 10, Oct. 1997, pp. 33–38.

*Primary Examiner*—Erma Cameron
(74) *Attorney, Agent, or Firm*—Fish & Associates, LLP; Robert D. Fish

(57) ABSTRACT

A method of making a dielectric film on a substrate from a composition containing an organohydridosiloxane resin is presented. The organohydridosiloxane resins have a cage conformation and 40 mole percent or greater of an organic substituent. The process of making a dielectric film includes forming a solution of a solvent and the organohydridosiloxane resin, dispensing the solution on a substrate, spinning the substrate, baking the substrate to remove the solvent, and curing the substrate to form the dielectric film. The dielectric films of the present invention exhibit dielectric constants of approximately 2.8 or lower.

2 Claims, No Drawings

FOREIGN PATENT DOCUMENTS

| | | |
|---|---|---|
| EP | 0 270 229 A2 A3 | 6/1988 |
| EP | 0 270 231 A2 A3 | 6/1988 |
| EP | 0 270 263 A2 A3 | 6/1988 |
| EP | 0 270 369 A2 A3 | 6/1988 |
| EP | 0 323 103 A2 | 7/1989 |
| EP | 0 323 186 A2 | 7/1989 |
| EP | 0 410 564 A2 A3 | 1/1991 |
| EP | 0 419 076 A1 | 3/1991 |
| EP | 0 427 395 A1 | 5/1991 |
| EP | 0 462 715 A1 | 12/1991 |
| EP | 0 461 782 A2 A3 | 12/1991 |
| EP | 0 466 205 A1 | 1/1992 |
| EP | 0 493 879 A2 A3 | 7/1992 |
| EP | 0 510 872 A1 | 10/1992 |
| EP | 0 512 717 A2 A3 | 11/1992 |
| EP | 0 516 144 A1 | 12/1992 |
| EP | 0 516 308 A1 | 12/1992 |
| EP | 0 560 485 A1 | 9/1993 |
| EP | 0 576 166 A2 | 12/1993 |
| EP | 0 596 678 A2 | 5/1994 |
| EP | 0 599 209 A2 A3 | 6/1994 |
| EP | 0 604 779 A1 | 7/1994 |
| EP | 0 606 580 A1 | 7/1994 |
| EP | 0 606 588 A1 | 7/1994 |
| EP | 0 615 000 A1 | 9/1994 |
| EP | 0 616 001 A1 | 9/1994 |
| EP | 0 652 246 A1 | 5/1995 |
| EP | 0 686 680 A1 | 12/1995 |
| EP | 0 725 103 A2 A3 | 8/1996 |
| GB | 2 199 817 A | 7/1988 |
| JP | 52-31854 | 8/1977 |
| JP | 53-88099 | 8/1978 |
| JP | 55-111148 | 8/1980 |
| JP | 56-139533 | 10/1981 |
| JP | 57-112047 | 7/1982 |
| JP | 58-003249 | 1/1983 |
| JP | 58-066335 | 4/1983 |
| JP | 59-109565 | 6/1984 |
| JP | 59-189126 | 10/1984 |
| JP | 59-190211 | 10/1984 |
| JP | 60-42426 | 3/1985 |
| JP | 60-86017 | 5/1985 |
| JP | 60-124943 | 7/1985 |
| JP | 61-029153 | 2/1986 |
| JP | 61-127732 | 6/1986 |
| JP | 61-292342 | 12/1986 |
| JP | 2-277255 | 11/1990 |
| JP | 3-6845 | 1/1991 |
| JP | 3-227321 | 10/1991 |
| JP | 4-252228 | 9/1992 |
| JP | 4-252229 | 9/1992 |
| WO | WO 97/10282 | 3/1997 |
| WO | 98-47944 | * 10/1998 |
| WO | 00-41230 | * 7/2000 |

* cited by examiner

DIELECTRIC FILMS FROM ORGANOHYDRIDOSILOXANE RESINS WITH HIGH ORGANIC CONTENT

RELATED APPLICATION

This application is a division of U.S. application Ser. No. 09/227,498, filed Jan. 7, 1999 now U.S. Pat. No. 6,218,020.

BACKGROUND

1. Field of the Invention

The present invention relates generally to dielectric films formed from siloxane based resins and methods of manufacturing those films, and more specifically to low dielectric constant films formed from high organic content organohydridosiloxane compositions and methods of manufacture thereof.

2. Related Art

Semiconductor devices often have one or more arrays of patterned interconnect levels that serve to electrically couple the individual circuit elements thus forming an integrated circuit (IC). These interconnect levels are typically separated by an insulating or dielectric film. Previously, a silicon oxide film formed using chemical vapor deposition (CVD) or plasma enhanced CVD (PECVD) techniques was the most commonly used material for such dielectric films. However, as the size of circuit elements and the spaces between such elements decreases, the relatively high dielectric constant of such silicon oxide films is problematic.

In order to provide a lower dielectric constant than that of silicon oxide, dielectric films formed from siloxane based resins are becoming widely used. One such family of films formed from siloxane based resins are the films derived from hydrogen silsesquioxane (HSQ) resins (See, U.S. Pat. No. 3,615,272, Oct. 19, 1971, Collins et al.; and U.S. Pat. No. 4,756,977, Jul. 12, 1988, Haluska et al.) However, while such films do provide lower dielectric constants than CVD or PECVD silicon oxide films and also provide other benefits such as enhanced gap filling and surface planarization, it has been found that typically the dielectric constants of such films are limited to approximately 3.0 or greater (See, U.S. Pat. No. 5,523,163, Jun. 4, 1996, Ballance et al.).

Since, as known, the dielectric constant of such insulating films is an important factor where IC's with low power-consumption, cross-talk, and signal delay are required, forming an insulating film with a dielectric constant below 3.0 is desirable. As siloxane based resin materials have beneficial gap filling and planarization properties, forming such films from siloxane based resin materials is very desirable. In addition, it would be desirable to have low dielectric constant films formed from siloxane based resin materials which have a high resistance to cracking. Additionally, it would be desirable to manufacture low dielectric constant films from siloxane based resins via standard processing techniques. In this manner curing processes that require an ammonia or ammonia derivative type of atmosphere (See, U.S. Pat. No. 5,145,723, Sep. 8, 1992, Ballance et al.), an ozone atmosphere (See, U.S. Pat. No. 5,336,532, Haluska et al.), or other non-standard type of semiconductor process, are avoided.

SUMMARY

In accordance with the present invention, methods of using solutions of organohydridosiloxane resins of high organic content to manufacture low dielectric constant insulating films are provided.

The solutions from which the dielectric films in accordance with the present invention are formed, contain organohydridosiloxane resins having one of the four general formulae:

| | |
|---|---|
| $(HSiO_{1.5})_n(RSiO_{1.5})_m$; or | Formula 1 |
| $(H_{0.4-1.0}SiO_{1.5-1.8})_n(R_{0.4-1.0}SiO_{1.5-1.8})_m$; or | Formula 2 |
| $(H_{0-0.1}SiO_{1.5-2.0})_n(RSiO_{1.5})_m$; or | Formula 3 |
| $(HSiO_{1.5})_x(RSiO_{1.5})_y(SiO_2)_z$ | Formula 4 | wherein:

the sum of n and m is from about 8 to about 5000, and m is selected such that the organic substituent is present to about 40 Mole percent (Mol %) or greater; the sum of x, y and z is from about 8 to about 5000 and y is selected such that the organic substituent is present to about 40 Mol % or greater; and R is selected from substituted and unsubstituted groups including normal and branched alkyl groups, cycloalkyl groups, aryl groups, and mixtures thereof; and wherein the specific Mol % of organic or carbon containing substituents is a function of the ratio of the amounts of starting materials.

Embodiments of the present invention employ solutions containing organohydridosiloxane resins having a caged structure. These organohydridosiloxane resins have a polymer backbone encompassing alternate silicon and oxygen atoms. In particular, each backbone silicon atom is bonded to at least three backbone oxygen atoms.

Essentially all additional silicon bonds are only to hydrogen and the organic substituents defined in Formulae 1, 2, 3, and 4. Thus, polymers of the present invention have essentially no hydroxyl or alkoxy groups bonded to backbone silicon atoms and cross-linking reactions are suppressed.

Some embodiments in accordance with the present invention employ spin coating techniques for application of solutions of the organohydridosiloxane resins. Typically, such resin solutions are approximately 5% to 35% (by weight) resin in an appropriate solvent.

In certain embodiments of the present invention, dielectric films formed from organohydridosiloxane resin solutions by spin coating methods are provided. Such dielectric films advantageously have low dielectric constants, typically less than 2.8.

DETAILED DESCRIPTION

As the present invention is described with reference to various embodiments thereof, it will be understood that these embodiments are presented as examples and not limitations of this invention. Thus, various modifications or adaptations of the specific materials and methods may become apparent to those skilled in the art. All such modifications, adaptations or variations that rely upon the teachings of the present invention as illustrated by the embodiments herein, are considered to be within the spirit and scope of the present invention.

Methods of forming dielectric films from solutions containing organohydridosiloxane resins are provided according to embodiments of the present invention. The solutions contain organohydridosiloxane resins having one of the four general formulae:

| | |
|---|---|
| $(HSiO_{1.5})_n(RSiO_{1.5})_m$; or | Formula 1 |
| $(H_{0.4-1.0}SiO_{1.5-1.8})_n(R_{0.4-1.0}SiO_{1.5-1.8})_m$; or | Formula 2 |
| $(H_{0-1.0}SiO_{1.5-2.0})_n(RSiO_{1.5})_m$; or | Formula 3 |
| $(HSiO_{1.5})_x(RSiO_{1.5})_y(SiO_2)_z$ | Formula 4 | wherein:

the sum of n and m is from about 8 to about 5000 and m is selected such that the organic substituent is present to about 40 Mole percent (Mol %) or greater; the sum of x, y and z is from about 8 to about 5000 and y is selected such that the organic substituent is present to about 40 Mol % or greater; and R is selected from substituted and unsubstituted groups including normal and branched alkyl groups, cycloalkyl groups, aryl groups, and mixtures thereof; and wherein the specific Mol % of organic or carbon containing substituents is a function of the ratio of the amounts of starting materials. In some embodiments of the present invention, the substituted and unsubstituted normal and branched alkyl groups have between about 1 and 20 carbons; the substituted and unsubstituted cycloalkyl groups have between about 4 and 10 carbons and the substituted and unsubstituted aryl groups have between about 6 and 20 carbons. For example, where 'R' is an alkyl group, 'R' includes but is not limited to methyl, chloromethyl and ethyl groups, and the normal and branched propyl, 2-chloropropyl, butyl, pentyl and hexyl groups. Where 'R' is a cycloalkyl group, 'R' includes but is not limited to cyclopentyl, cyclohexyl, chlorocyclohexyl and cycloheptyl groups; where 'R' is an aryl group, 'R' includes but is not limited to phenyl, napthyl, tolyl and benzyl groups. In some embodiments, particularly favorable results are obtained with the mole percent of organic substituents being in the range of between about 40 Mol % to about 80 Mol %. For substituent R a methyl group, this range corresponds to a carbon content of the organohydridosiloxane resin of between about 8% and about 14% by weight.

The organohydridosiloxane resins used in making dielectric films, according to embodiments of the present invention, can have molecular weights between about 400 and 200,000 atomic mass units. All molecular weights are reported as weight average molecular weights. Preferably the resins have molecular weights between about 5000 and 60,000 atomic mass units, more preferably between about 10,000 and 50,000 atomic mass units, and most preferably between about 20,000 and 40,000 atomic mass units.

The organohydridosiloxane resins used in making the dielectric films are further described in U.S. patent application Ser. No. 09/044,798, now U.S. Pat. No. 6,143,855, entitled "ORGANOHYDRIDOSILOXANE RESINS WITH HIGH ORGANIC CONTENT", which is commonly assigned with the present application and is incorporated herein by reference Methods of the present invention typically employ spin coating techniques for application of films containing organohydridosiloxane resins. As one of ordinary skill in the art knows, semiconductor substrates are currently available in a variety of sizes ranging from as small as three or four inches in diameter to as large as twelve inches in diameter. Therefore, it will be understood that the process parameters presented hereinafter are for a four inch or six inch wafer and are for illustrative purposes only. Thus, modifications to the volume of material, solution concentration, rotational speeds or the various times described below are appropriate for any specific application. It will be further understood, therefore, that all such modification are within the scope and spirit of the present invention.

A solution of organohydridosiloxane resin is prepared by combining the resin with an appropriate solvent. Typically, such resin solutions are approximately 5% to 35% (by weight) resin. Advantageously, methyl isobutyl ketone (MIBK), heptane, dodecane, butyl ether, butyl acetate, isobutyl acetate, propyl acetate or a blend of hexamethyldisiloxane, octamethyltrisiloxane, and octamethylcyclotetrasiloxane, or combinations thereof are useful as solvents, although other appropriate solvents may also be employed. Prior to use, the solvents are preferably dried over 3 Å or 4 Å molecular sieves.

The resulting solution is then filtered under ambient conditions via any of the filtration devices well known in the art. It is generally preferable to use a filtration device having a pore size less than about 1 $\mu$m. A typical filtration process uses a pore size of about 0.1 $\mu$m.

In the spin coating process, the organohydridosiloxane resin solution prepared in the manner described above is dispensed onto a wafer at or near its center. In some embodiments, the wafer will remain stationary during the dispense cycle, while in some embodiments, the wafer will turn or spin at a relatively low speed, typically less than about 500 revolutions per minute (rpm). The dispense cycle is followed by a short rest period and then additional spins, hereinafter referred to as thickness spins, generally between approximately 2000 and 3000 rpm, although other spin speeds may be used, as appropriate.

Once the coating process, as described above, is completed, the coated substrate, that is the substrate coated with the resin solution, is heated to effect a bake process and a subsequent cure process. The bake process removes the solvent from the resin solution on the substrate, causes the polymer to flow, and begins the conversion of the coating to the dielectric film. The cure process completes the conversion of the coating to the dielectric film. Any conventional apparatus known in the art can be employed for these processes.

Preferably, the apparatus for the bake process is an integral part of a spin coating apparatus used for coating the substrate or wafer, although a separate apparatus for curing coatings applied in accordance with embodiments of the present invention is also suitable. The bake process can be carried out in an inert atmosphere such as an atmosphere of an inert gas, nitrogen, or nitrogen/air mixture. One commonly employed heating apparatus employs one or more "hot plates" to heat the coated wafer from below. The coated wafer is typically heated for up to about 120 sec at each of several hot plates at successively higher temperatures. Typically, the hot plates are at temperatures between about 70° C. and 350° C. One typical process employs a heating apparatus having three hot plates. First, the wafer is baked for about 60 sec at 150° C. Then the wafer is transferred to a second hot plate for an approximately 60 sec bake period at 200° C. Finally, the wafer is transferred to a third hot plate for a third bake period of approximately 60 sec at 350° C.

A final cure process is preferably employed to complete the curing of the film. The cure is preferably performed in an inert atmosphere, as described above for the bake process. This final cure process can employ a conventional thermal curing apparatus, for example a horizontal furnace with a temperature range of about 300° C. to about 450° C. and preferably from about 375° C. to about 425° C. In a typical furnace cure process, the baked wafer is cured for 30 minutes to one hour at 400° C. at a nitrogen flow rate of 4 liters/min to 20 liters/min.

Alternatively, the cure process can employ a high-temperature hot plate curing module which has an oxygen-density-controlled environment. In this process, the baked wafer is cured on a hot plate at a temperature between about 400° C. and 450° C. for a period of from about 1 to about 15 minutes in a nitrogen or inert atmosphere with an oxygen density of less than about 100 parts per million. For example, a suitable cure atmosphere is achieved with a nitrogen flow rate of between about 10 and about 30 liters/min.

It will be understood that the above bake and cure processes were described for illustrative purposes only and that other temperatures, durations, and number of bake cycles can be employed, where appropriate.

The thickness of the resulting dielectric film on a substrate depends on a number of variables. The variables include, organic content of the organohydridosiloxane resin, type of substituent in the resin, solvent properties, resin molecular weight, percentage of the resin solids in the resin solution, the amount of resin solution dispensed onto the substrate, and the speed of the thickness spin. The higher the percentage of resin solids in the solution, the thicker the resulting dielectric film. Conversely, the higher the speed of the thickness spin, the thinner the resulting dielectric film. In addition, the thickness of the dielectric film can depend on the nature and amount of the organic constituents in the organohydridosiloxane resin.

According to embodiments of the present invention, dispensing 2 ml of resin solution that is between about 5% and about 35% resin by weight on a 4 inch wafer, using a spin speed between about 2000 and about 3000 rpm, results in dielectric films ranging from about 1000 Å to about 9000 Å in thickness. Variation in thickness, determined by independent measurements on a single wafer, ranges from about 0.4% to 3.2% and preferably the variation in thickness is less than 1%.

In certain embodiments of the present invention, dielectric films formed from organohydridosiloxane resin solutions by spin coating methods are provided. The dielectric films are formed from solutions of organohydridosiloxane resins having a mole percent of organic substituents preferably in the range between about 40 Mol % and about 80 Mol %. As demonstrated in the examples below, such dielectric films advantageously exhibit low dielectric constants, typically approximately 2.8 or lower The following characteristics encompass non-limiting measurements that illustrate the properties of films of organohydridosiloxane polymer resins of the present invention. The methods of measurement used are as follows:

1) Film Thickness (Å): Film thickness is measured using a calibrated Nanospec® AFT-Y CTS-102 model 010-180 Film Thickness Measurement System available from Nanometrics, Co. An average of measurements at five locations on a wafer are reported as the film thickness for each sample. Thickness measurements are corrected for the refractive index as measured on a Rudolph ellipsometer.
2) Refractive Index: Refractive index is measured on a Rudolph Research AutoEL ellipsometer using a wavelength of 633.3 nm.
3) Dielectric Constant: Dielectric constant is determined using the capacitance-voltage ("CV") measurement technique and employs a Hewlett-Packard Model 4061A semiconductor measurement system at a frequency of 1 MHz. This test procedure employs a metal-insulator-metal (MIM) structure with the thickness of each layer ranging from about 0.5 to 1 micron ($\mu$m).
4) Solution Viscosity (cP): A Brookfield Synchro-lectric Viscometer, Model LVT 62238 is employed to measure the viscosity of organohydridosiloxane resin solutions at ambient temperature.
5) Isothermal TGA: Cured films are carefully removed from the wafers, heated to 100° C. and held for one hour to equilibrate before recording initial weight. The instrument is then ramped from 100° C. to 425° C. at 25° C. per minute (under nitrogen atmosphere) and held at 425° C. for four hours to determine percent weight loss.
6) Planarization: Polymer films are spun on silicon wafers patterned with line and space patterns of varying widths (0.35–3.0 $\mu$m). The wafers are baked and cured using the appropriate recipe. The cured wafers are then cleaved horizontally across the pattern of lines and this cross-section is examined using a scanning electron microscope (SEM). The degree of planarization for a particular line and space width is calculated by measuring the ratio of the highest point of the film versus the lowest point.
7) Stress: Film stress is measured using a Flexus™ model 2410 Film Stress Measurement System available from Tencor Instruments using standard methods.
8) Crack Threshold: A single coat film is spun, baked, and cured on a bare silicon wafer using the appropriate recipe in 1000 Å thickness increments. The wafers are examined 24–48 hrs following cure to check for cracking.

EXAMPLE 1

Methyl isobutyl ketone (MIBK) (127.4 g) was dried over 4 Å molecular sieves and combined with 28 g of 80 Mol % methylhydridosiloxane resin, which contains approximately 14% carbon, as measured by Rutherford back scattering, to form an 18 weight % resin solution. The solution was filtered to 0.2 $\mu$m. The solution was coated on a bare 4 inch silicon wafer using a conventional spin coater. Approximately 3 ml of the polymer solution was placed on the wafer. After a 3 second delay, the wafer was spun at 2000 rpm for 20 seconds. The coated wafer was baked on three successive hot plates for one minute each at 150° C., 200° C., and 350° C., respectively. The baked wafer was then cured in a nitrogen atmosphere in a horizontal furnace set initially at 300° C., followed by a ramp to 380° C. at a rate of 4° C./minute, where it was held for 10 minutes, then increased to 400° C. at a rate of 1° C./minute. The furnace temperature was held at 400° C. for one hour and then lowered back to 300° C. over a period of about 2 hours. Film thickness for Examples 1–6, determined after the bake step and determined again after the cure step, corrected for refractive index, is given below in Table 1.

EXAMPLE 2

A siloxane solvent blend (hexamethyldisiloxane, octamethyltrisiloxane, and octamethylcyclotrisiloxane) (57.4 g) was dried over 4 Å molecular sieves and combined with 12.6 g of 80 Mol % methylhydridosiloxane resin to form an 18 weight % resin solution. The solution was filtered to 0.2 $\mu$m. Approximately 3 ml of the polymer solution was placed on a bare 4 inch silicon wafer. After a 3 second delay, the wafer was spun at 3000 rpm for 20 seconds. The coated wafer was baked on three successive hot plates for one minute each at 150° C., 200° C., and 350° C., respectively. The baked wafer was then cured in a nitrogen atmosphere in a horizontal furnace set initially at 300° C., followed by a ramp to 360° C. at a rate of 4° C./minute, where it was held for 5 minutes, then increased to 380° C. at a rate of 1° C./minute. The furnace temperature was held at 380° C. for 30 minutes and then lowered back to 300° C. over a period of about 2 hours.

EXAMPLE 3

The siloxane solvent blend as in Example 2 (661.5 g) was dried over 4 Å molecular sieves and combined with 238.5 g of 80 Mol % methylhydridosiloxane resin to form a 26.5 weight % resin solution. The solution was filtered to 0.1 μm. The solution was dispensed on a silicon wafer, which was spun, baked, and cured as in Example 2.

EXAMPLE 4

40 Mol % methylhydridosiloxane resin (14 g), which contains approximately 9% carbon, as measured by Rutherford back scattering, was combined with MIBK solvent (63.7 g) to form an 18 weight % resin solution. The solution was dispensed on a silicon wafer, which was spun and baked as in Example 1. The baked wafer was then cured in a nitrogen atmosphere in a furnace set initially at 300° C. followed by a ramp to 400° C. at a rate of 4° C./minute, held at 400° C. for one hour and then lowered back to 300° C. over a period of about 2 hours.

EXAMPLE 5

60 Mol % methyl/20 Mol % benzyl hydridosiloxane resin was combined with MIBK solvent to form an 18 weight % resin solution. The solution was dispensed on a silicon wafer, which was spun and baked as in Example 1. The baked wafer was then cured in a nitrogen atmosphere in a furnace set initially at 300° C. followed by a ramp to 380° C. at a rate of 4° C./minute, held at 400° C. for one hour and then lowered back to 300° C. over a period of about 2 hours.

EXAMPLE 6

60 Mol % methyl/20 Mol % chloromethyl hydridosiloxane resin was combined with MIBK solvent to form an 18 weight % resin solution. The solution was dispensed on a silicon wafer, which was spun, baked, and cured as in Example 5.

TABLE 1

THICKNESS OF FILMS FROM EXAMPLES 1–6

| Example | Baked Thickness (Å) | Baked Non-Uniformity | Cured Thickness (Å) | Cured Non-Uniformity |
|---|---|---|---|---|
| Example 1 | 4202 | 0.4% | 4304 | 0.8% |
| Example 2 | 3911 | 1.6% | 4032 | 1.1% |
| Example 3 | 9129 | 1.0% | 9535 | 1.3% |
| Example 4 | 4575 | 0.4% | 4755 | 0.7% |
| Example 5 | 4493 | | 4595 | |
| Example 6 | 3545 | | 3720 | |

EXAMPLE 7

An 18 weight % resin solution of an 80 Mol % methylhydridosiloxane resin in a variety of solvents was spun and baked as described in Example 4. The film thickness after bake, corrected for the refractive index is given below in Table 2.

TABLE 2

THICKNESS OF FILMS OF 80 MOL % METHYLHYDRIDOSILOXANE RESIN IN DIFFERENT SOLVENTS

| Solvent | Refractive Index | Film Thickness (Å) |
|---|---|---|
| Acetone | 1.437 | 7580 |
| Cyclohexanone | 1.391 | 4380 |
| Cyclopentanone | 1.399 | 4865 |
| 1,2 dimethoxy propane (DMP) | 1.361 | 8517 |
| MIBK | 1.395 | 4352 |

EXAMPLE 8

Resin solutions of 80 Mol % methylhydridosiloxane resin in the siloxane solvent were prepared by the methods of Example 2 (18 weight % resin) and Example 3 (26.5 weight % resin). The solutions were dispensed on a wafer, spun for 20 seconds at speeds between 1000 and 5000 rpm, and baked as given in Examples 2 and 3. Thickness after bake as a function of spin speed is given below in Tables 3 and 4.

TABLE 3

THICKNESS OF FILMS OF 80 MOL % METHYLHYDRIDOSILOXANE RESIN IN SILOXANE SOLVENT (18% RESIN) AS FUNCTION OF SPIN SPEED

| Speed (RPM) | Baked Thickness (Å) | Baked Non-Uniformity (%) |
|---|---|---|
| 1000 | 7454 | 3.5 |
| 2000 | 4994 | 1.5 |
| 3000 | 4037 | 0.5 |
| 4000 | 3480 | 0.7 |
| 5000 | 3162 | 1.0 |

TABLE 4

THICKNESS OF FILMS OF 80 MOL % METHYLHYDRIDOSILOXANE RESIN IN SILOXANE SOLVENT (26.5% RESIN) AS FUNCTION OF SPIN SPEED

| Speed (RPM) | Baked Thickness (Å) | Baked Non-Uniformity (%) |
|---|---|---|
| 1000 | 16289 | 3.2 |
| 2000 | 10784 | 3.2 |
| 3000 | 8821 | 2.8 |
| 4000 | 7606 | 1.3 |
| 5000 | 6620 | 0.6 |

EXAMPLE 9

Viscosity of solutions of 80 Mol % methylhydridosiloxane resin in different solvents are given below in Table 5.

TABLE 5

VISCOSITY OF SOLUTIONS OF 80 mol % METHYLHYDRIDOSILOXANE RESIN

| Solvent | % solids | Viscosity (cP) |
|---|---|---|
| MIBK | 19 | 1.72 |
| MIBK | 30.0 | 3.24 |
| Siloxane blend | 18 | 5.11 |
| Siloxane blend | 26.5 | 10.86 |

EXAMPLE 10

Properties of the dielectric films of Examples 1 and 4 are given below in Table 6.

TABLE 6

PROPERTIES OF DIELECTRIC FILMS

| Property | Example 1 | Example 4 |
|---|---|---|
| Dielectric constant MIM parallel plate, 1 Mhz | 2.5 | 2.8 |
| Refractive index (film cured at 400° C.) | 1.37 | 1.356 |
| Stress | 50 kpsi | 84 kpsi |
| Isothermal Weight loss @ 425° C., 4 hr | 0.3%/hr | Not measured |
| Planarization over a 1 μm line and space pattern | 91% | Not measured |
| Crack threshold | 1 μm | Not measured |

As it can be seen, dielectric constants for films according to the present invention were approximately 2.8 or lower. These values may be compared with the dielectric constant of a film of a previously known hydridosiloxane resin with no organic substituents, cured at 400° C. which exhibits a dielectric constant of 3.27. In view of the foregoing, it will be understood that the present invention provides methods of preparing dielectric films of organohydridosiloxane resins containing 40 mole percent or greater of organic substituents. It will be understood these methods of preparing dielectric films employ standard processing techniques of semiconductor fabrication, avoiding use of ammonia, ozone, or other non-standard atmospheres. Further, it will be understood that the present invention additionally includes the dielectric films so produced. These films are advantageously used in semiconductor devices as insulating materials with low dielectric constants.

We claim:

1. A method of making a dielectric film on a substrate comprising:

forming a solution of a solvent and an organohydridosiloxane resin comprising a polymer having a general formula:

$[HSiO_{1.5}]_n[RSiO_{1.5}]_m$, or $[H_{0.5-1.0}SiO_{1.5-1.8}]_n[R_{0.5-1.0}SiO_{1.5-1.8}]_m$, or $[H_{0.1-0}SiO_{1.5-2.0}]_n[RSiO_{1.5}]_m$, or $[HSiO_{1.5}]_x[RSiO_{1.5}]_y[SiO_2]_z$, wherein the organohydridosiloxane resin comprises an organic substituent;

wherein the sum of n and m is from about 8 to about 5000, m is selected such that the organic substituent is present in an amount of about 40 Mole percent (Mol %) or greater, the sum of x, y and z is from about 8 to 5000, y is selected such that the organic substituent is present in an amount of about 40 Mol % or greater, and R, in any general formula, is selected from chloro-substituted and unsubstituted normal and branched alkyl groups, cycloalkyl groups, aryl groups, and mixtures thereof;

dispensing the solution on the substrate;

spinning the substrate to form an organohydridosiloxane resin coated substrate;

baking the organohydridosiloxane resin coated substrate to remove any residual solvent, cause said polymer to flow, and partially convert said resin to said dielectric film; and curing the organohydridosiloxane resin coated substrate on a hot plate to a cure temperature for a cure time period in an oxygen-density-controlled atmosphere, wherein said conversion to said dielectric film is completed.

2. The method of claim 1 wherein the cure temperature is at least about 400° C.; the cure time period is less than or equal to about 15 minutes and the atmosphere is controlled such that the oxygen density is less than about 100 parts per million.

* * * * *